United States Patent [19] [11] Patent Number: 4,569,063
Perry [45] Date of Patent: Feb. 4, 1986

[54] DIGITAL PHASE LOCKING ARRANGEMENT FOR SYNCHRONIZING DIGITAL SPAN DATA

[75] Inventor: Thomas J. Perry, Phoenix, Ariz.

[73] Assignee: GTE Automatic Electric Incorporated, Northlake, Ill.

[21] Appl. No.: 506,562

[22] Filed: Jun. 22, 1983

[51] Int. Cl.[4] .............................................. H03D 3/24
[52] U.S. Cl. ..................................... 375/119; 375/82; 370/100
[58] Field of Search .......................... 370/100, 110.1; 375/119, 120, 38, 100, 81, 82, 111; 455/8; 328/63, 72; 307/527, 528

[56] References Cited
U.S. PATENT DOCUMENTS

| 4,216,544 | 8/1980 | Boleda et al. | 375/119 |
| 4,234,956 | 11/1980 | Adderley et al. | 375/38 |
| 4,280,099 | 7/1981 | Rattlingourd | 375/119 |
| 4,308,619 | 12/1981 | Hughes | 375/119 |
| 4,380,814 | 4/1983 | Shinmyo | 375/100 |

Primary Examiner—Robert L. Griffin
Assistant Examiner—Stephen Chin
Attorney, Agent, or Firm—Frank J. Bogacz; Peter Xiarhos

[57] ABSTRACT

In a PCM telecommunications switching system, an arrangement for deriving a clock signal from incoming PCM data of a digital span is shown. This derived clock signal is synchronized and continuously locked to the incoming PCM data of the digital span. The present digital phase locking arrangement cyclically adjusts the derive clock signal so that on the average synchronism is maintained.

11 Claims, 3 Drawing Figures

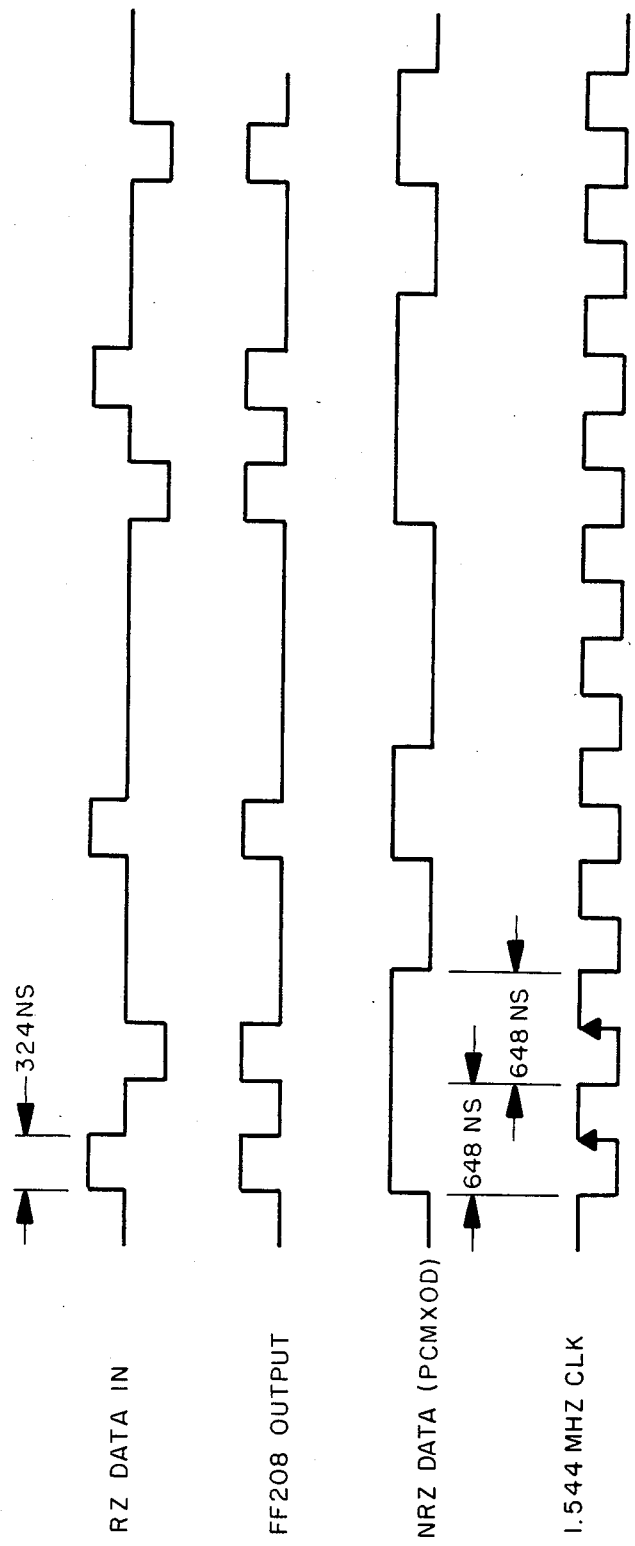

DIGITAL PHASE LOCKING ARRANGEMENT FOR SYNCHRONIZING DIGITAL SPAN DATA

BACKGROUND OF THE INVENTION

The present invention pertains to data transmission and reception between telecommunications switching systems via digital spans and more particularly to a digital phase locking arrangement for synchronizing the reception of digital span data.

In telecommunications switching, it is necessary to send large amounts of data between switching offices. To efficiently accomplish this result, high speed data link between these switching offices have been developed. These high speed data links are termed T-carrier transmission facilities. For example, these T-carrier transmission facilities include T-1, T-2, etc. digital span line equipment, which provide data at high speed in data formats DS-1 or DS-2, respectively.

Modern telecommunications switching offices handle communications between a number of different sources. Thereby, the switching office is required to handle a number of different digital spans. These digital spans transmit their data asynchronously with respect to one another. The switching office requires data reception circuitry for each of its digital span units. Due to the asynchronous transmission of the digital spans, a master clocking arrangement is ineffective to enable data reception for a number of digital spans.

In addition, high speed signals drift over a period of time.

Accordingly, it is the object of the present invention to provide an efficient and small in size digital phase locking arrangement for synchronizing the reception of high speed digital span data.

SUMMARY OF THE INVENTION

In a PCM telecommunications switching system, digital spans are connected to a switching network of the switching system. A digital phase locking arrangement is connected between the switching network and the digital spans for synchronizing the digital PCM data of the digital span for processing by the switching network.

A switching network provides a network clock signal of a particular frequency. This particular frequency must be counted down to provide a second frequency necessary for operating a digital span. The digital phase locking arrangement includes a first digital control oscillator which is connected to the switching network and operates in response to the network clock signal to produce the down counted output signal of the second frequency.

The digital phase locking arrangement further has a digital phase detector which is connected to the digital control oscillator and to the digital span. The digital phase detector operates in response to the output signal of the second frequency of the digital control oscillator and in response to the digital span data. As a result, the digital phase detector produces phase signal of a particular logic value for the digital span data leading the output signal or alternatively, it produces a phase signal of a second logic value for the digital span data lagging the output signal frequency.

In addition, a digital filter is connected to the digital span, to the digital phase detector and to the digital control oscillator. The digital filter operates in response to a number of phase signals of a first logic value to transmit one additional clock pulse to the digital control oscillator. Alternatively, the digital filter operates in response to a number of phase signals of a second logic value to inhibit one clock pulse being transmitted to the digital control oscillator.

In response to the phase signals of the first and second logic values, the digital control oscillator produces an output signal of a first or a second modified frequency, respectively.

DESCRIPTION OF THE DRAWING

FIG. 3 is a timing diagram of various signals of the digital phase locking arrangement.

DESCRIPTION OF THE PREFERRED EMBODIMENT

Figure 1:
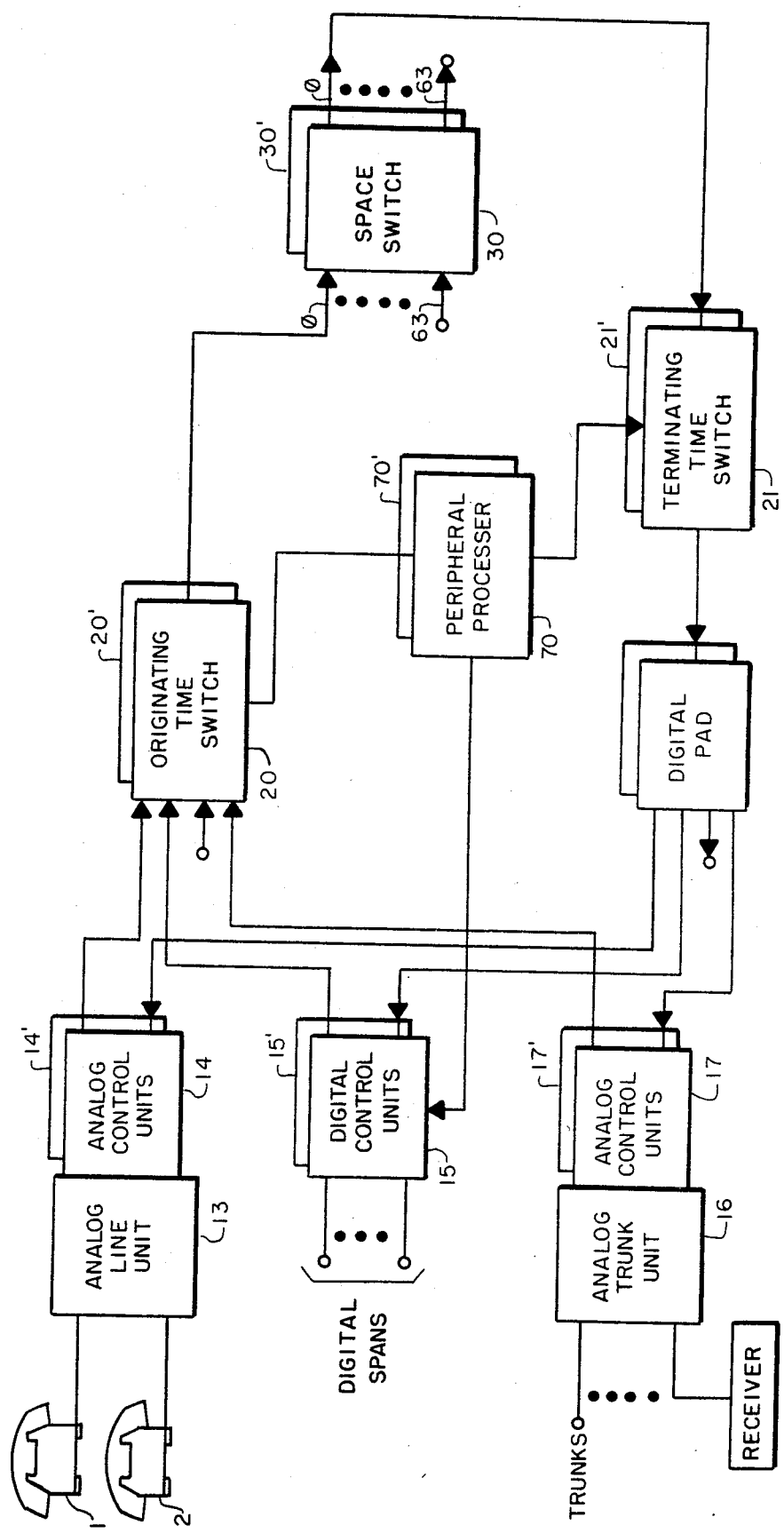
FIG. 1 is a block diagram of a telecommunications system embodying the present invention.

Referring to FIG. 1, a time-space-time PCM digital switching network along with the corresponding common control is shown. Telephone subscribers, such as subscribers 1 and 2, are shown connected to analog line unit 13. Analog line unit 13 is connected to both copies of the analog control unit 14 and 14'. Originating time switches 20 and 20' are connected to duplex pair of space switch units 30 and 30' which are in turn connected to the terminating time switch 21 and 21'. Time switch and control units 21 and 21' are connected to analog control unit 14 and 14' and ultimately to the telephone subscribers 1 and 2 via analog line circuit 13.

Digital control units 15 and 15' connect the digital spans to the switching network. Digital span equipment may be implemented using a model 9004 T1 digital span manufactured by GTE Lenkurt Inc. Similarly, analog trunk unit 16 connects trunk circuits to the digital switching network via analog control units 17 and 17'.

A peripheral processor CPU 70 controls the digital switching network and digital and analog control units. Analog line unit 13 and a duplex pair of analog control units 14 and 14' interface to telephone subscribers directly. A duplicate pair of digital control units 15 and 15' control the incoming PCM data from the digital spans. Similarly, the analog trunk unit 16 and a duplex pair of analog control units 17 and 17' interface to trunk circuits. The analog and digital control units are each duplicated for reliability purposes.

Figure 2:
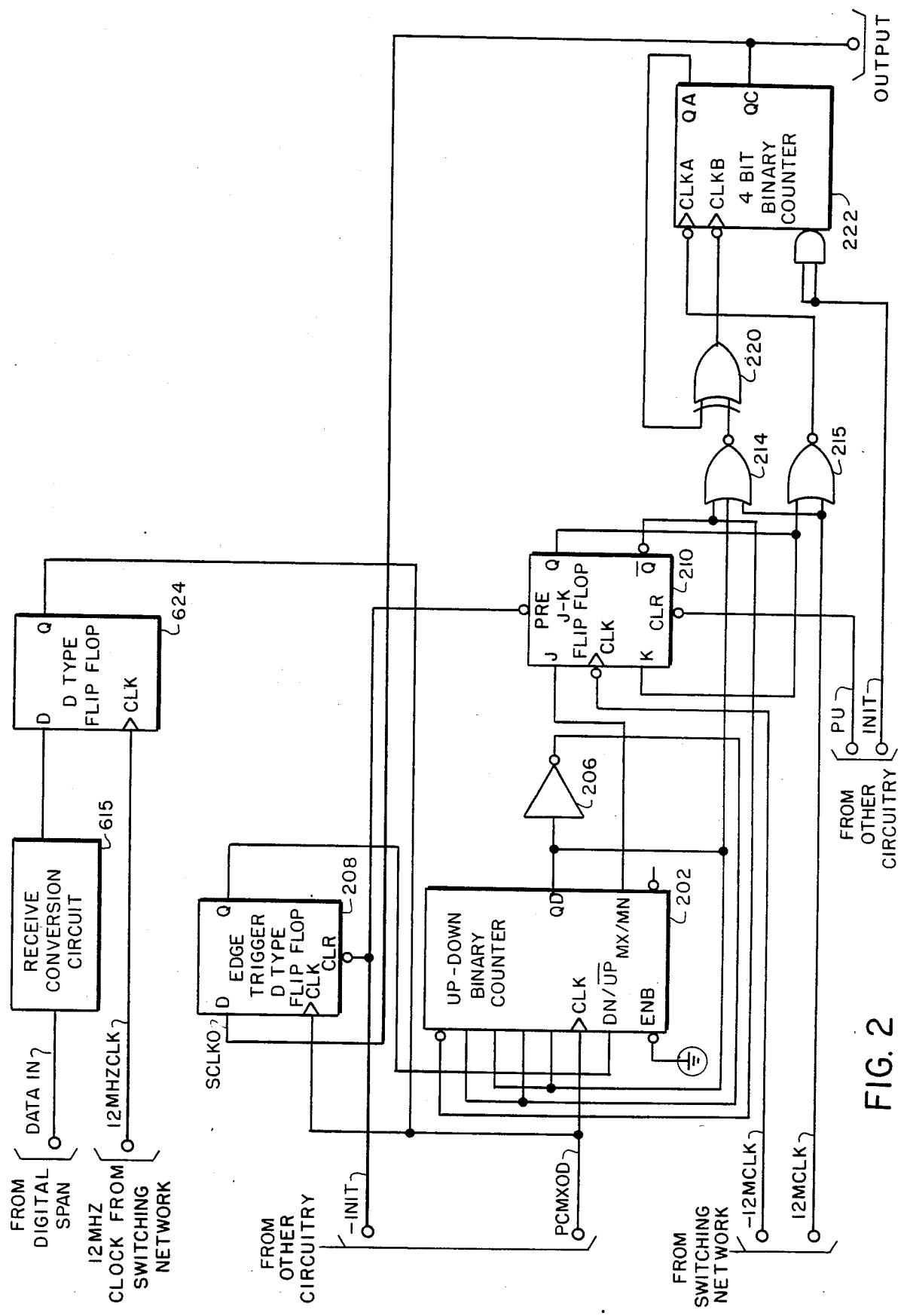
FIG. 2 is a schematic diagram of a digital phase locking arrangement embodying the principles of operation of the present invention.

Referring to FIG. 2, a digital voltage controlled oscillator is provided by NOR gate 214, NOR gate 215, EXCLUSIVE-OR gate 220 and 4-bit binary counter 222. A 12.352 MHz signal is applied by the switching network via the 12MCLK lead to NOR gates 214 and 215. Normally counter 222 along with gates 214, 215 and 220 function as a divide by 8 circuit. As a result, the QC output of counter 222 is a 1.544 MHz clock signal which is necessary to extract data from the digital span.

Data from one particular digital span is transmitted via the DATAIN lead to receive conversion circuit 615. The TTL compatible output of the receive conversion circuit 615 is applied to D-type flip-flop 624 via the D lead. A 12 MHz clock signal from the switching network is applied via the CLK input to D-type flip-flop 624. As a result, TTL compatible PCM data is provided on PCMXOD lead.

Edge triggered flip-flop 208 is connected to flip-flop 624 via the PCMXOD lead and to counter 222 via the SCLK0 lead. This flip-flop functions as a digital phase detector. Flip-flop 208 provides via its Q output a pulse of 81 nanoseconds in duration which is coincident with the rising edge of the data provided by the PCMXOD lead. See FIG. 3. The Q output of flip-flop 208 is connected to up-down binary counter 202 via its UP/DOWN lead. This signal causes the up-down counter 202 to be incremented or decremented depending upon the phase relationship between the data on the PCMXOD lead and the phase of the derived clock of counter 222 via the SCLK0 lead.

Up-down counter 202, inverter 206 and JK flip-flop 210 provide the equivalent of a digital low pass filter. Counter 202 is connected to flip-flop 624 via the PCMXOD lead, and to flip-flop 208, and to inverter 206. Flip-flop 210 is connected to counter 202 via the MX/MIN output and to NOR gates 214 and 215. As long as the proper phase relationships are maintained between the signals on the PCMXOD lead and the SCLK0 leads, counter 202 will remain disabled. If the receive data waveform on the PCMXOD lead is leading the derived clock (the SCLK0 lead), flip-flop 208 will produce a signal that will enable counter 202 to count down. Similarly, if the receive data waveform on the PCMXOD lead is lagging the derived clock (the SCLK0 lead), then flip-flop 208 will produce a signal causing counter 202 to count upward.

Normally, counter 202 begins at approximately the middle of its counting range via a set of predefined initial conditions on its inputs. Should flip-flop 208 provide counter 202 with a series of downward count pulses (indicating that the PCMXOD signal is leading the SCLK0 signal), counter 202 will contain a value of 0. As a result, of this 0 value the MX/MIN output of counter 202 will be a "1" thereby, setting JK flip-flop 210. Furthermore, since the QD output of counter 202 is a 0, the output of NOR gate 214 will pulse. As a result, counter 222 will provide a double count thereby, increasing the derived clock rate of the SCLK0 lead. Therefore, the 1.544 MHz clock on the SCLK0 lead will be adjusted since, the receive data signal on the PCMXOD lead leads this derived clock.

In response to a series of up counts (indicating that the receive data waveform on the PCMXOD lead is lagging the derived clock on the SCLK0 lead), counter 202 will take on the value of 15 or binary 1111. Since the QD output of counter 202 is a "1," the output of NOR gate 214 will not pulse. As a result, counter 222 will not count causing the signal on lead SCLK0 to skip one clock pulse. This has the effect of slowing down the derived clock signal on the SCLK0 since, the receive data signal on the PCMXOD lead is lagging the derived clock on the SCLK0 lead.

Whenever counter 202 underflows (value equal 0) or overflows (value equal 15), the $\overline{Q}$ output of JK flip-flop 210 causes asynchronous load via the LD input of counter 202, thereby resetting counter 202 to the approximate middle of its counting range.

When the Q output of flip-flop 210 goes to "1," the 12 MHz clock from the network on the 12MCLK lead is prevented from being applied to the CLK lead of counter 222 by NOR gate 215. When the receive data signal on lead PCMXOD is lagging the derived clock on lead SCLK0, the Q output of flip-flop 210 goes to a 1 preventing the application of the 12MCLK signal to the CLKA input of counter 222. Eighty nanoseconds later, the Q output of flip-flop 210 goes to a 0 and counter 222 is permitted to resume normal counting. The effect is that counter 222 has missed one clock pulse.

When it becomes necessary to double count or speed up the derived clock rate (indicating that the receive data signal on the PCMXOD lead is leading the derived clock signal on the SCLK0 lead), the output of NOR gate 214 will provide a 40 nanosecond pulse which will force the output of EXCLUSIVE-OR gate 220 to switch, thereby clocking the CLKB input to counter 222. Since the CLKB input of counter 222 increments the counter by 2, the effect is to provide a double count.

FIG. 3 depicts the proper phase relationship of the RZ data in signal with the clock signal provided by flip-flop 208 on its output and the NRZ data provided via the PCMXOD lead along with the 1.544 MHz derived clock. It is to be noted that the 1.544 MHz derived clock is in phase with the receive data (PCMXOD) when the rising edge of the drive clock occurs during the middle of data bits in the NRZ format.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. In a PCM telecommunications switching system having a switching network and at least one digital span, a digital phase locking arrangement connected between said switching network and said digital span for synchronizing digital PCM data of said digital span, said digital phase locking arrangement comprising:
   said switching network providing a network clock signal of a first frequency;
   digital control oscillator means connected to said switching network and being operated in response to said network clock signal of a first frequency to produce an output signal of a second frequency;
   digital phase detection means connected to said digital control oscillator and to said digital span, said digital phase detection means being operated in response to said output signal and to digital span data to cyclically produce a phase signal of a first value or alternatively to cyclically produce a phase signal of a second value;
   digital filter means connected to said digital span, to said digital phase detection means and to said digital control oscillator means, said digital filter means being operated in response to a plurality of phase signals of said first value to transmit one additional clock pulse to said digital control oscillator means or alternatively said digital filter means being operated in response to a plurality of phase signals of said second value to inhibit one clock pulse transmitted to said digital control oscillator means via said network clock signal; and
   said digital control oscillator means being operated in response to said digital filter means to produce said output signal of a first modified frequency or alternatively to produce said output signal of a second modified frequency.

2. A digital phase locking arrangement as claimed in claim 1, wherein there is further included means for synchronizing connected to said digital span, to said digital phase detection means, to said digital filter means and to said switching network, said means for synchronizing operated to delay said digital span data for a fixed time period.

3. A digital phase locking arrangement as claimed in claim 2, said digital control oscillator means including:
   first gating means connected to said switching network; and
   first counter means connected to said first gating means, said first counter means including:
      a first input connection providing one count for each input signal; and
      a second input connection providing at least two counts for each input signal.

4. A digital phase locking arrangement as claimed in claim 3, said first gating means including a first NOR gate having an output connection.

5. A digital phase locking arrangement as claimed in claim 3, said first counter means including a four-bit binary counter connected to said output connections of said first NOR gate.

6. A digital phase locking arrangement as claimed in claim 5, said digital phase detection means including first latching means connected to said first counter means and to said means for synchronizing.

7. A digital phase locking arrangement as claimed in claim 6, said digital filter means including:
   second counter means connected to said means for synchronizing and to said first latching means, said second counter means being operated to count up continuously or alternatively being operated to count down continuously;
   said second counter providing a MIN output signal when said second counter reaches a value of zero;
   second latching means connected to said second counter means and to said switching network, said second latching means providing a latch output signal in response to said MIN output signal; and
   second gating means connected to said switching network, to said second latching means, to said first gating means and to said first counter means, said second gating means operated in response to said latch output signal to enable said first counter means to produce two counts via said second input connection of said first counter means.

8. A digital phase locking arrangement as claimed in claim 7, said second counter means including an up-down binary counter.

9. A digital phase locking arrangement as claimed in claim 8, said second latching means including a JK flip-flop.

10. A digital phase locking arrangement as claimed in claim 9, said second gating means including:
    a second NOR gate connected to said JK flip-flop and to said up-down binary counter; and
    an EXCLUSIVE-OR gate connected to said second NOR gate and to said four-bit binary counter.

11. A digital phase locking arrangement as claimed in claim 6, said first latching means including an edge triggered D-type flip-flop.

* * * * *